United States Patent
Takahashi et al.

(10) Patent No.: US 9,147,571 B2
(45) Date of Patent: *Sep. 29, 2015

(54) WELDED BELLOWS FOR SEMICONDUCTOR MANUFACTURING DEVICE

(75) Inventors: Hidekazu Takahashi, Tokyo (JP); Masahiko Inoue, Tokyo (JP); Hiroyuki Ochiai, Tokyo (JP)

(73) Assignees: EAGLE INDUSTRY CO., LTD., Tokyo (JP); EAGLEBURGMANN JAPAN CO., LTD., Tokyo (JP)

( * ) Notice: Subject to any disclaimer, the term of this patent is extended or adjusted under 35 U.S.C. 154(b) by 19 days.

This patent is subject to a terminal disclaimer.

(21) Appl. No.: 14/110,651

(22) PCT Filed: Mar. 9, 2012

(86) PCT No.: PCT/JP2012/056062
§ 371 (c)(1),
(2), (4) Date: Oct. 8, 2013

(87) PCT Pub. No.: WO2012/147417
PCT Pub. Date: Nov. 1, 2012

(65) Prior Publication Data
US 2014/0082906 A1 Mar. 27, 2014

(30) Foreign Application Priority Data
Apr. 26, 2011 (JP) .................. 2011-097758

(51) Int. Cl.
*F16J 15/00* (2006.01)
*H01L 21/00* (2006.01)
*F16J 3/04* (2006.01)

(52) U.S. Cl.
CPC ................. *H01L 21/00* (2013.01); *F16J 3/047* (2013.01); *Y10T 29/41* (2015.01)

(58) Field of Classification Search
USPC ........................................ 277/389, 500, 634
See application file for complete search history.

(56) References Cited

U.S. PATENT DOCUMENTS 3,773,337 A * 11/1973 Adams ......................... 277/392
4,573,693 A * 3/1986 Nakata et al. ................. 277/636

(Continued)

FOREIGN PATENT DOCUMENTS

| JP | S45-019670 B1 | 7/1970 |
| JP | S58-004848 U1 | 7/1983 |

(Continued)

OTHER PUBLICATIONS

Notification of Transmittal of Translation of the International Preliminary Report on Patentability (PCT/IB/338) mailed Nov. 7, 2013, with International Preliminary Report on Patentability (PCT/IB/373) and Written Opinion of the International Searching Authority (PCT/ISA/237), for corresponding international application PCT/JP2012/056062.

(Continued)

*Primary Examiner* — Kristina Fulton
*Assistant Examiner* — Eugene G Byrd
(74) *Attorney, Agent, or Firm* — Law Office of Katsuhiro Arai (57) ABSTRACT

An accordion-structured welded bellows for a semiconductor-manufacturing device is characterized in that a plurality of annular bellows plates having curved surfaces in a radial direction are connected in an alternating fashion on the outside-diameter side and the inside-diameter side, wherein the annular bellows plates have a processing-side bellows plate and a non-processing-side bellows plate, a gas layer is interposed between the two bellows plates, the processing-side bellows plate is configured as a thick plate, and the non-processing-side bellows plate is configured as a thin plate. The welded bellows is less likely to be damaged by foreign matter and to be able to use the non-processing-side bellows plate to compensate for any damage to the processing-side bellows plate.

8 Claims, 6 Drawing Sheets

(56) References Cited

U.S. PATENT DOCUMENTS

| | | | | |
|---|---|---|---|---|
| 4,967,609 A | * | 11/1990 | Takagi et al. | 74/18 |
| 5,525,047 A | * | 6/1996 | Sternenberg et al. | 417/307 |
| 5,924,697 A | * | 7/1999 | Parker et al. | 277/369 |
| 6,182,755 B1 | * | 2/2001 | Mansure | 166/180 |
| 6,764,243 B1 | * | 7/2004 | Inuzuka et al. | 403/50 |
| 8,550,740 B2 | * | 10/2013 | Brunneke et al. | 403/50 |
| 8,727,355 B2 | * | 5/2014 | Takahashi et al. | 277/500 |
| 2004/0221808 A1 | * | 11/2004 | Kawano | 118/715 |
| 2012/0013076 A1 | * | 1/2012 | Takahashi | 277/391 |

FOREIGN PATENT DOCUMENTS

| | | |
|---|---|---|
| JP | S62-251570 A | 11/1987 |
| JP | H04-282499 A | 10/1992 |
| JP | H06-281000 A | 10/1994 |
| JP | H09-072419 A | 3/1997 |
| WO | 2012/147416 A1 | 11/2012 |

OTHER PUBLICATIONS

International Search Report (ISR), mailed May 29, 2012, issued for International application No. PCT/JP2012/056062.

* cited by examiner

WELDED BELLOWS FOR SEMICONDUCTOR MANUFACTURING DEVICE

TECHNICAL FIELD

This application is the U.S. National Phase under 35 U.S.C. §371 of International Application PCT/JP2012/056062, filed Mar. 9, 2012, which claims priority to Japanese Patent Application No. 2011-097758, filed Apr. 26, 2011. The International Application was published under PCT Article 21(2) in a language other than English.

The present invention relates to an accordion-shaped welded bellows having sealing properties and flexibility, the bellows being used in a sealed part of a semiconductor-manufacturing device; and relates, for example, to a welded bellows suitable for sealing a gate valve with which an opening in a vacuum processing chamber can be opened and closed in an airtight manner.

BACKGROUND ART

Figure 4:
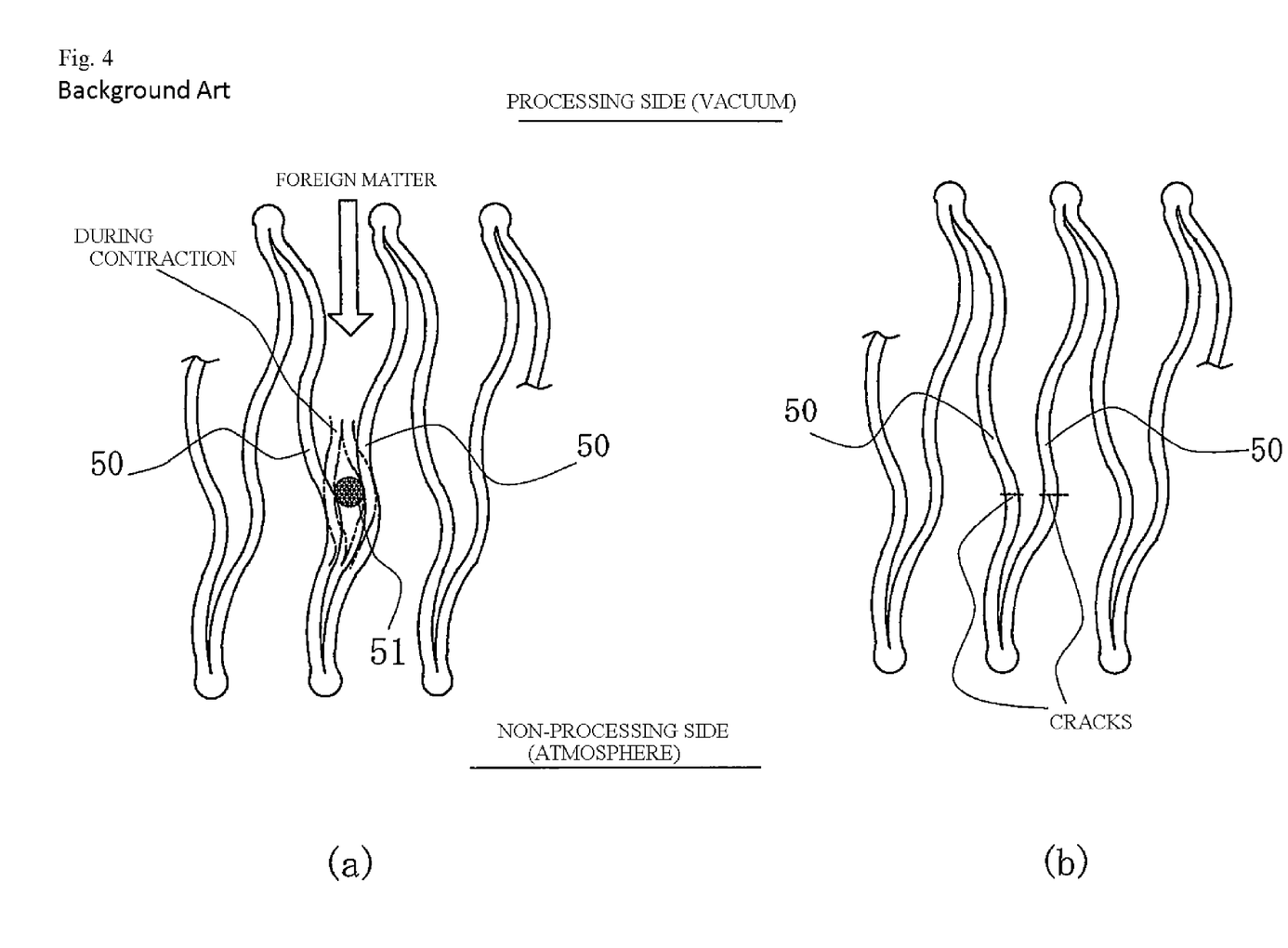
FIG. 4 is a schematic diagram of an essential part for describing Prior Art 1.

Accordion-shaped welded metal bellows having sealing properties and flexibility can be compressed until the bellows plates closely contact one another, and therefore are used for sealing moving members of a variety of instruments. For example, a welded metal bellows used for sealing a gate valve with which an opening in a vacuum processing chamber used in a manufacturing step of a semiconductor-manufacturing device can be opened and closed in an airtight manner is used to seal off a vacuum side and an atmosphere side. As shown in FIG. 4, individual bellows plates 50 are connected by being welded on the inside-diameter side and the outside-diameter side into a bellows shape, and the bellows is repeatedly extended and contracted over a period of several million strokes at a high speed (hereinafter referred to as "Prior Art 1"). A problem of this type of bellows is that when a foreign matter present in the vacuum atmosphere, such as a metal particle 51, enters between the bellows plates 50 in the manner shown in FIG. 4(a), the bellows plates 50 undergo bending deformation during contraction according to the lever principle, as shown by the dashed and dotted lines; cracks appear in the bellows plate 50 near the metal particle 51 during repeated extension and contraction, as shown in FIG. 4(b); and the bellows eventually fails, resulting in a shorter-than-designed service life and making the bellows unusable.

Figure 5:
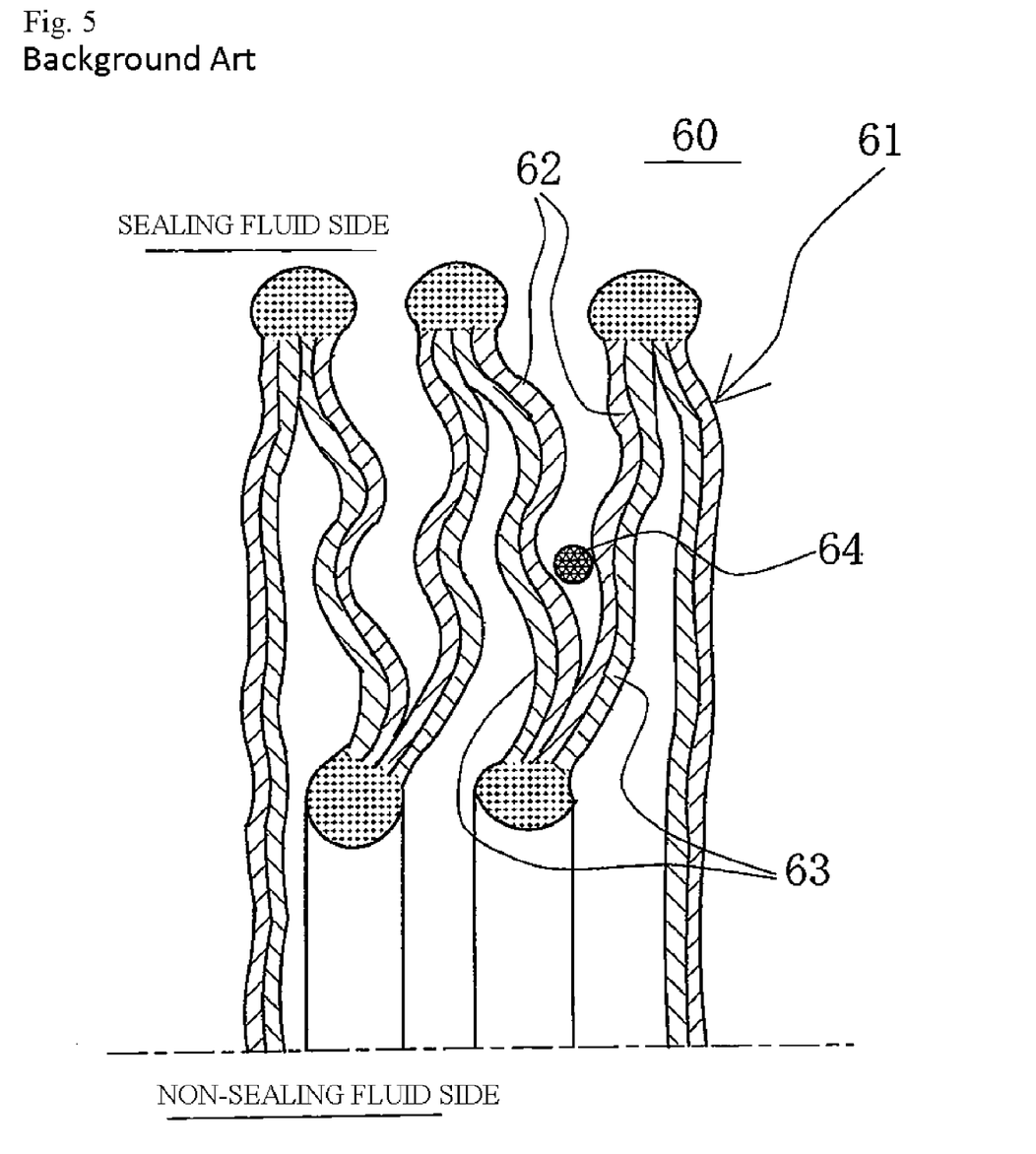
FIG. 5 is a partial cross-sectional view for describing Prior Art 2.

A variety of welded metal bellows have been proposed in the past. For example, a welded metal bellows 60 such as the one shown in FIG. 5 is known as one having excellent corrosion resistance and operating spring properties (hereinafter referred to as "Prior Art 2"; for example, see Patent Document 1). The bellows plates 61 from which the accordion-structured structure of the bellows 60 according to Prior Art 2 is configured are shaped in two layers in which austenite stainless steel plates 62 are arranged to the sealing fluid side, spring steel plates 63 are arranged to the non-sealing fluid side, and the plates are joined together by welding on the inside-diameter side and the outside-diameter side.

Figure 6:
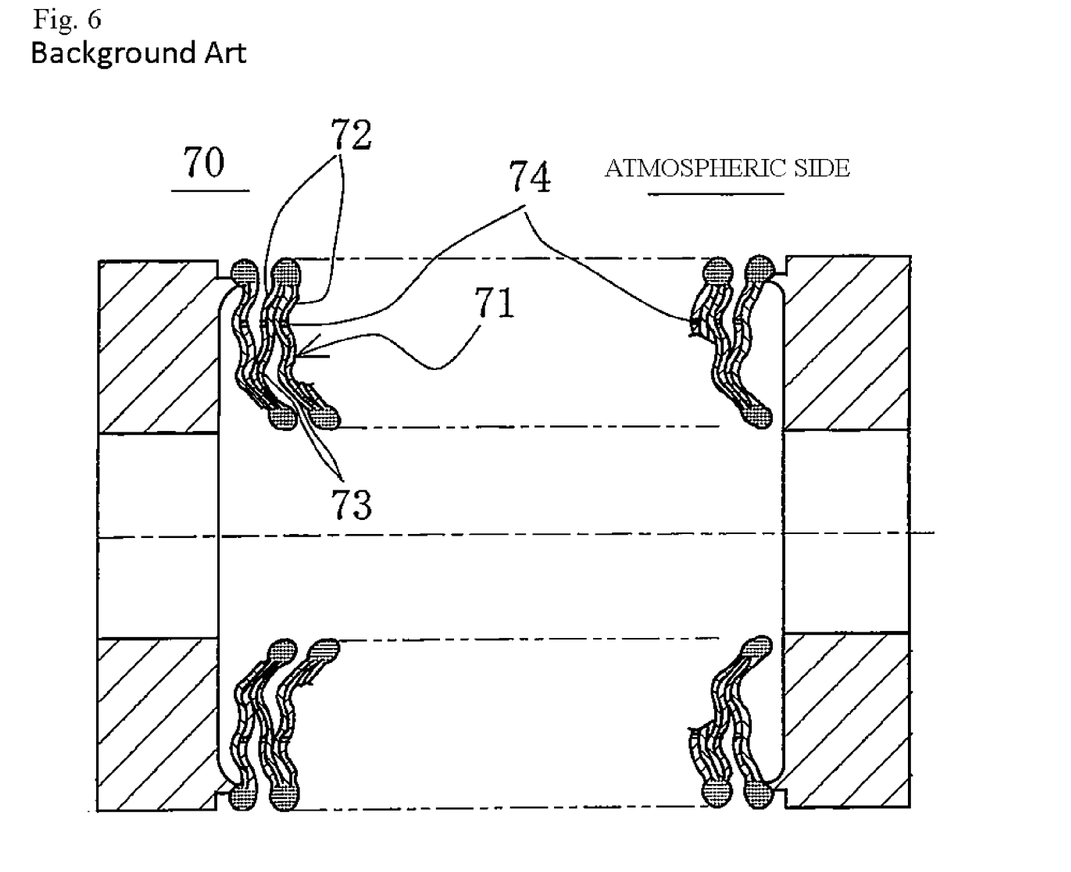
FIG. 6 is a partial cross-sectional view for describing Prior Art 3.

Additionally, a welded metal bellows 70 such as the one shown in FIG. 6 is known as one that provides a bellows capable of withstanding great pressure without sacrificing the flexibility of the bellows (hereinafter referred to as "Prior Art 3"; for example, see Patent Document 1). The bellows plates 71 from which the accordion-structured structure of the bellows 70 according to Prior Art 3 is configured are shaped in two layers in which two circular plates 72, 73 of uniform thickness are joined by welding on the inside-diameter side and the outside-diameter side. The plates are configured so that air holes 74 are provided to the circular plate 72 on the atmospheric side, and there are no gas pockets present between the circular plates 72, 73.

However, Prior Art 2 shown in FIG. 5 provides a welded bellows having excellent corrosion resistance and operating spring properties and has no countermeasures in place against repeated bending deformation due to the ingress of foreign matter. A resulting problem is that the two bellows plates 62, 62 undergo repeated bending deformation when foreign matter 64 enters between the bellows plates 62, 62 on the sealing fluid side, and the two bellows plates fail one after the other or both at the same time.

Prior Art 3 shown in FIG. 6 provides a bellows capable of withstanding significant pressure without sacrificing flexibility. Air holes 74 are formed in the bellows plates 72 on the atmospheric side. A resulting problem is that the bellows can no longer maintain sealing action when the bellows plates 73 on the side opposite from the atmospheric side fail as a result of repeated bending deformation due to the ingress of foreign matter, and the same service life is ultimately obtained as in the case of single bellows plates.

CITATION LIST

Patent Literature

Patent Document 1: Japanese Unexamined Utility Model Application Publication No. 58-4848
Patent Document 2: Japanese Examined Patent Publication No. 45-19670

SUMMARY OF INVENTION

Technical Problem

The present invention was devised in order to solve the problems of the above-described prior art and is aimed at providing a redundant welded bellows for a semiconductor-manufacturing device in which the bellows plates are provided with a double-layer structure, wherein the two bellows plates of welded bellows are configured so that the processing-side (vacuum) bellows plate is endowed with a function as a sealing and reinforcing member and that the bending deformation in the non-processing side (atmospheric) bellows plate is reduced, whereby any damage to the processing-side bellows plate can be compensated for by the non-processing-side bellows plate.

Solution to Problem

Aimed at attaining the above-described object, the welded bellows for a semiconductor-manufacturing device according to a first aspect of the present invention to accomplish the above described purpose is an accordion structured welded bellows for a semiconductor-manufacturing device in which a plurality of annular bellows plates having curved surfaces in a radial direction are connected in an alternating fashion on the outside-diameter side and the inside-diameter side, characterized in that an annular bellow plates is provided with a processing-side bellows plate and a non-processing-side bellows plate, a gas layer is interposed between the two bellows plates, the processing-side bellows plate is configured as a thick plate, and the non-processing-side bellows plate is configured as a thin plate.

The welded bellows for a semiconductor-manufacturing device according to a second aspect of the present invention is the welded bellows according to the first aspect, characterized in that the processing side is a vacuum and the non-processing side is the atmosphere.

The welded bellows for a semiconductor-manufacturing device according to a third aspect of the present invention is the welded bellows according to the first or second aspect, characterized in being used for sealing a gate valve with which an opening in a vacuum processing chamber used in a manufacturing step of a semiconductor-manufacturing device can be opened and closed in an airtight manner.

The welded bellows for a semiconductor-manufacturing device according to a fourth aspect of the present invention is the welded bellows according to any of the first to third aspects, characterized in being actuated to extend and contract within a range of several hertz, the extension and contraction speed being 100 mm/sec or greater, and the cyclic service life being $1 \times 10^6$ or greater.

Advantageous Effects of Invention

The present invention exhibits excellent effects such as those described below.

(1) The processing-side bellows plate is thick, and therefore durable, and is relatively tolerable to foreign matter due to the presence of an air, Ar, or other gas layer as a backing layer.

In addition, the non-processing-side bellows plate has reduced bending deformation because the bending deformation brought about in the processing-side bellows plate by the ingress of foreign matter is transmitted via a gas layer, and even a repeated bending deformation that occurs over an extended period of time does not lead to failure because the plate itself is thin and can therefore follow the bending deformation.

(2) A redundant welded bellows provided with a double-layer safety measure can be provided because any damage to the processing-side bellows plate can be compensated for by the non-processing-side bellows plate due to the plates being configured so that the processing-side bellows plate is endowed with a function as a sealing and reinforcing member, and the non-processing-side bellows plate is endowed only with a sealing function to prevent the plate from failing even after extended use.

DESCRIPTION OF EMBODIMENTS

A mode for implementing the welded bellows for a semiconductor-manufacturing device according to the present invention will be described in detail below with reference to the drawings. The present invention is not to be interpreted as being limited to the description and may have a variety of changes, corrections, and improvements added thereto on the basis of the knowledge of those skilled in the art without departing from the scope of the present invention.

Figure 1:
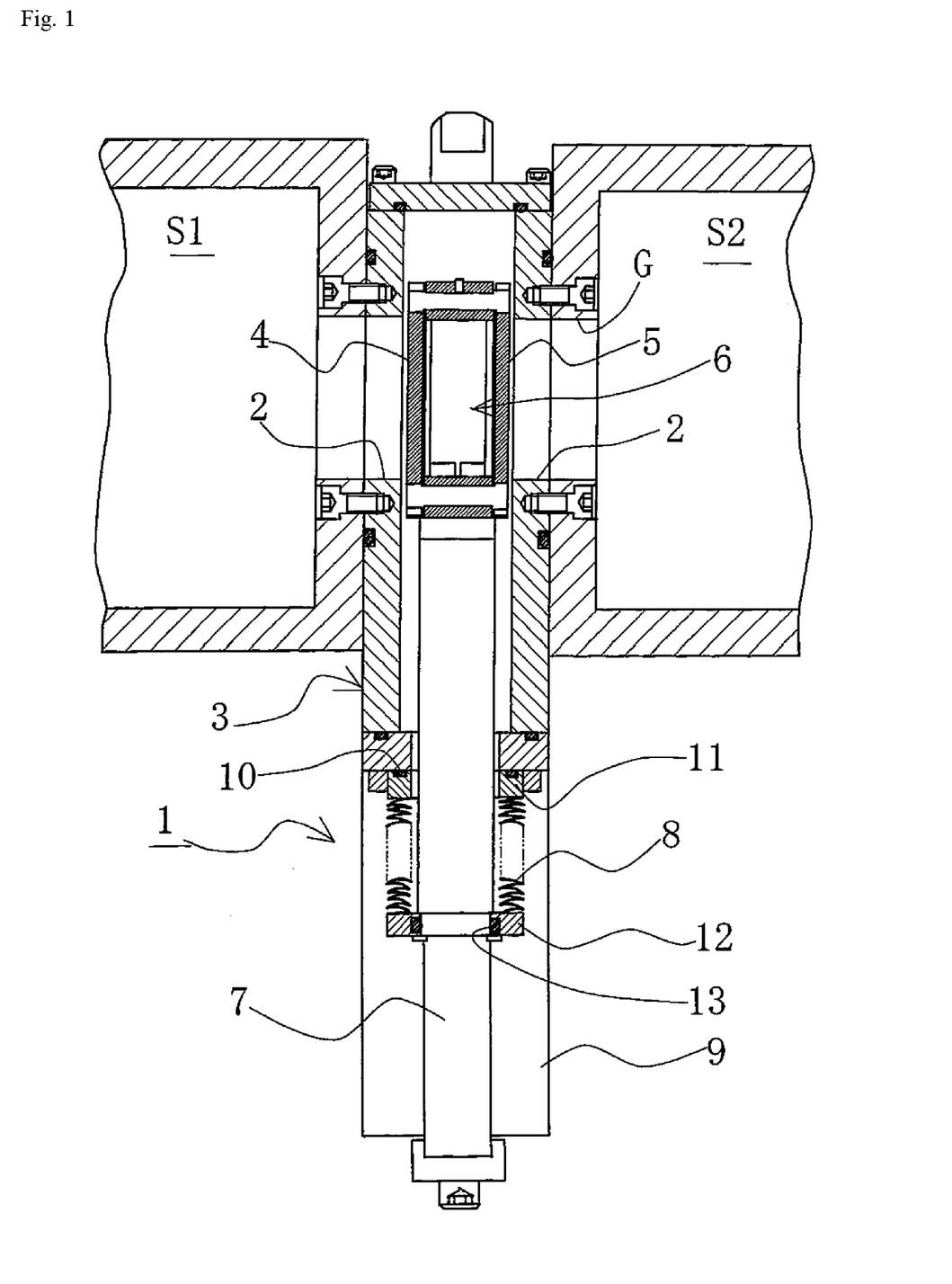
FIG. 1 is a partial cross-sectional view showing an instance in which the welded bellows for a semiconductor-manufacturing device according to an embodiment of the present invention is used for sealing a support rod of a gate valve with which an opening in a vacuum processing chamber used for a manufacturing step of the semiconductor-manufacturing device can be opened and closed in an airtight manner.

FIG. 1 is a partial cross-sectional view showing an instance in which the welded bellows for a semiconductor-manufacturing device according to an embodiment of the present invention is used for sealing a support rod of a gate valve with which an opening in a vacuum processing chamber used for a manufacturing step of the semiconductor-manufacturing device can be opened and closed in an airtight manner.

In FIG. 1, a gate valve 1 has a valve box 3 in which through holes 2 are formed in positions that face each other, a valve assembly 6 provided with a pair of valve plates 4, 5 and arranged within the valve box 3, a support rod 7 by which the valve assembly 6 is supported at the distal end, a bellows 8 for sealing the valve box 3 side and the support rod 7 side, and an air cylinder 9 for moving the valve assembly 6 between an opened-valve position and a closed-valve position via the support rod 7.

The gate valve 1 is provided, for example, between vacuum processing chambers S1, S2 in a semiconductor-manufacturing step. The valve assembly 6 is made to move between an opened-valve position and a closed-valve position by the support rod 7, compressed air is supplied to or discharged from an air supplying device and a vacuum pump (not shown) to the valve assembly 6 in the closed-valve position, and a pair of valve plates 4, 5 press against or separate from the periphery of the through holes 2, whereby the gate G of each vacuum processing chamber S1, S2 can be opened and closed.

The bellows 8 of the gate valve 1 according to the present embodiment is a metallic member for sealing the valve box 3 side and the support rod 7 side, and one end of the bellows 8 is fixed by, for example, a fixing member, or is joined by welding or the like, to an upper ring member 11 while being kept in an airtight state. The upper ring member is fixed to the bottom plate of the valve box 3 via an O-ring 10. The other end of the bellows 8 is also fixed by, for example, a fixing member, or is joined by welding or the like, to a lower ring member 12 that is fitted in place to the support rod 7. Additionally, an O-ring 13 is interposed between the lower ring member 12 and the support rod 7, allowing the valve box 3 to be sealed even when the support rod 7 moves up and down, and making it possible to prevent contaminant foreign matter such as foreign particles or the like from infiltrating from the outside.

In a semiconductor-manufacturing step, deposits (referred to as "foreign matter" in the present invention) adhering to the walls and other parts of the processing chamber may be whirled up or introduced into the bellows 8 when the inside pressure of the processing chamber is changed to normal or reduced pressure by the supply or discharge of a purge gas. The size of the foreign matter corresponds to a maximum diameter of about several hundred microns (e.g., about 0.5 mm to 0.6 mm). Therefore, the bellows plates of the bellows 8 undergo bending deformation and repeated bending stress according to the lever principle, with the foreign matter as the fulcrum, during extension and contraction when the foreign matter enters into the bellows 8. The bellows 8 of the gate valve 1 according to the present embodiment must withstand being extended and contracted approximately $3 \times 10^6$ times in a range of about 0.1 Hz to 5 Hz, and avoiding failure was difficult with welded bellows configured as in the prior art described above.

Figure 2:
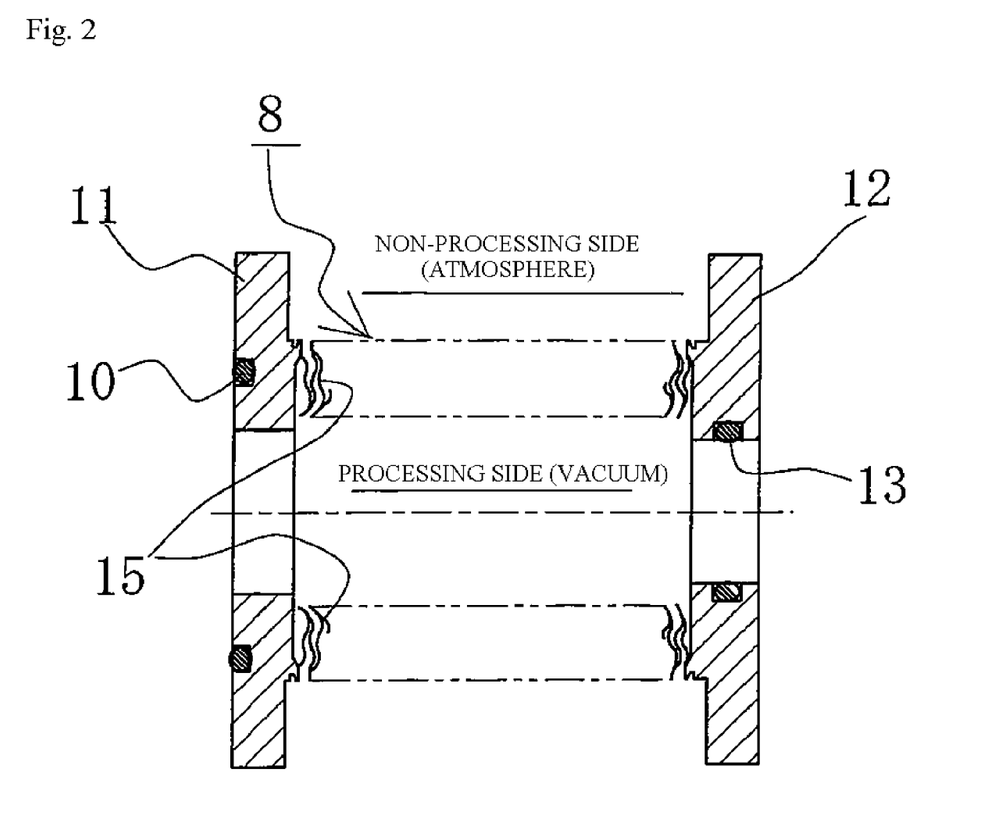
FIG. 2 is a cross-sectional view showing the overall configuration of the welded bellows for a semiconductor-manufacturing device according to an embodiment of the present invention.

FIG. 2 is a cross-sectional view showing the overall configuration of the welded bellows for a semiconductor-manufacturing device according to an embodiment of the present invention.

In FIG. 2, the bellows 8 is formed in an accordion structure so that a plurality of annular bellows plates 15 having radially curved surfaces are connected in an alternating manner on the outside-diameter side and the inside-diameter side.

The bellows plates 15 are connected together by TIG welding or the like in the atmosphere or an Ar gas environment.

In the drawing, the inside-diameter side of the bellows 8 is the processing side and, for example, has a degree of vacuum of $1 \times 10^{-6}$ Pa. The outside-diameter side of the bellows 8 is the non-processing side and is under atmospheric pressure.

The bellows 8 is, for example, set to operate in a range of about 0.5 L to 1.2 L relative to the free length L. In addition, the speed of extension and contraction during operation reaches 100 mm/s or greater.

The bellows 8 is formed from a metallic material. For example, the upper ring member 11 and the lower ring member 12 are formed from an austenitic stainless steel, and the bellows plates 15 are formed from a precipitation-hardened semi-austenitic stainless steel.

Figure 3:
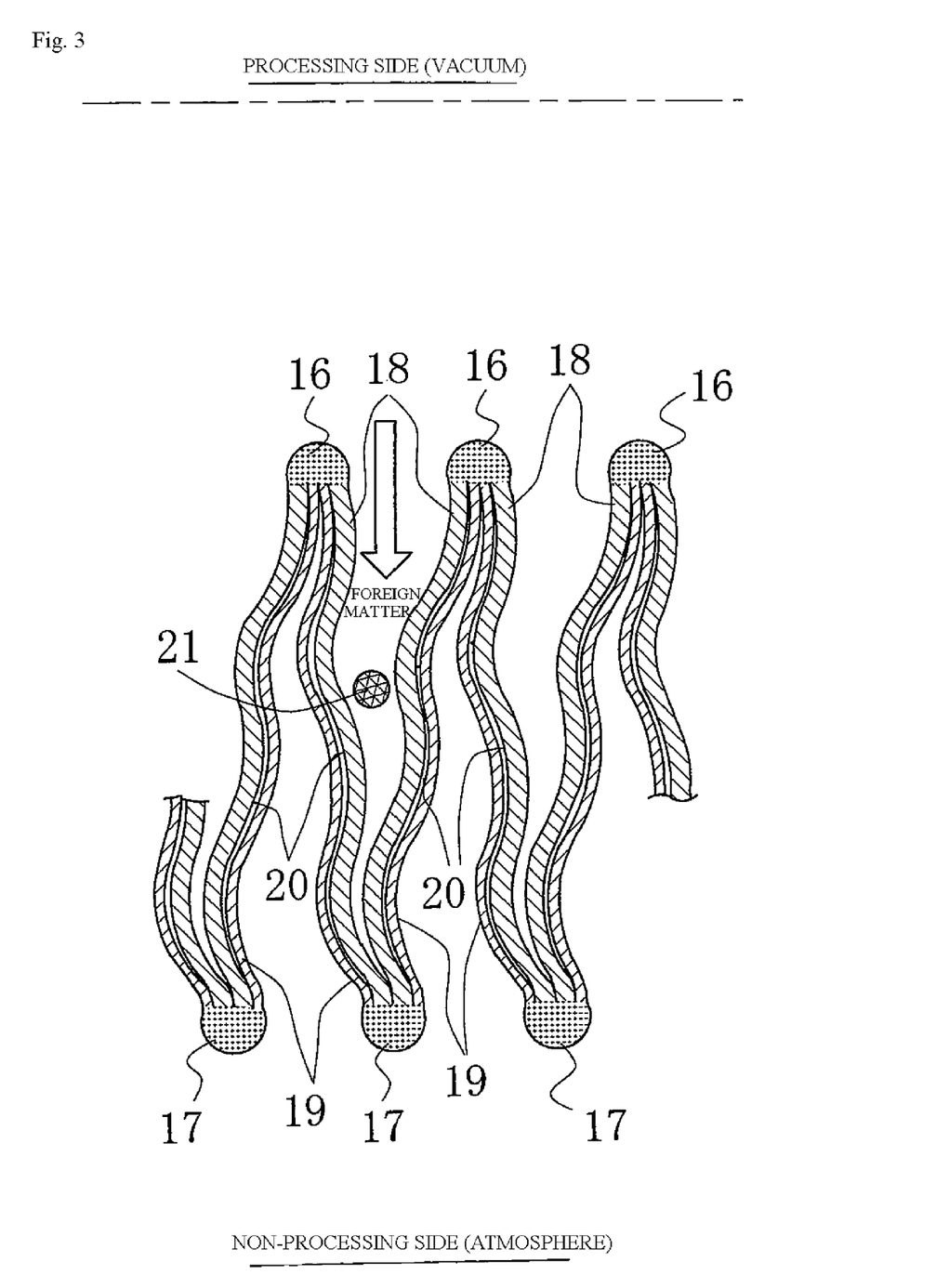
FIG. 3 is a schematic diagram showing an essential part of the welded bellows for a semiconductor-manufacturing device according to an embodiment of the present invention.

FIG. 3 is a schematic diagram showing an essential part of the welded bellows for a semiconductor-manufacturing device according to embodiment 1 of the present invention. The top of the drawing is the processing side (vacuum), and the bottom is the non-processing side (atmospheric).

In FIG. 3, the bellows 8 is formed into an accordion structure so that a plurality of annular bellows plates 15 having radially curved surfaces are connected by welding in an alternating manner on the inside-diameter side 16 and the outside-diameter side 17. The bellows plates 15 have a double layer of a processing-side bellows plate 18 and a non-processing-side bellows plate 19; and an air, Ar, or other gas layer 20 is interposed between the processing-side bellows plate 18 and the non-processing-side bellows plate 19. In addition, the processing-side bellows plate 18 is configured as a thick plate, and the non-processing-side bellows plate 19 is configured as a thin plate. The thicknesses of the processing-side bellows plate 18 and the non-processing-side bellows plate 19 can be set with consideration to the operating conditions, but while the processing-side bellows plate 18 is required to have sealing functions and to function as a reinforcing member, the non-processing-side bellows plate 19 maintains the sealing function by compensating for any failure of the processing-side bellows plate 18 that may occur. For this reason, the processing-side bellows plate 18 is formed as a thick plate so that the bellows plate will not fail easily even when foreign matter 21 enters between two adjacent bellows plates 15, 15; and the non-processing-side bellows plate 19 is formed as a thin plate so as to be flexible, deform readily, and withstand repeated bending deformation even when foreign matter 21 enters between two adjacent bellows plates 15, 15.

The thickness is preferably set within the range of $t2/t1=0.1$ to 0.7, where t1 is the thickness of the processing-side bellows plate 18, and t2 is the thickness of the non-processing-side bellows plate 19.

A precipitation-hardened semi-austenitic stainless steel is commonly used as the material for the processing-side bellows plate 18 and the non-processing-side bellows plate 19. However, the material does not need to be the same and can be selected according to the characteristics. For example, the processing-side bellows plate 18 can be precipitation-hardened semi-austenitic stainless steel, and the non-processing-side bellows plate 19 can be mild steel or spring steel. The exposed surface of the processing-side bellows plate 18 may also be coated with a fluororesin or a silicone resin to prevent foreign matter 21 from coming into direct contact with the metal surface.

An air, Ar, or other gas layer 20 is formed between the processing-side bellows plate 18 and the non-processing-side bellows plate 19. The gas layer 20 is formed by welding and sealing the bellows plates 18, 19, with a moderate gap left therebetween, when the inside-diameter side 16 and the outside-diameter side 17 of the bellows plates 18, 19 are welded in the atmosphere or an Ar gas environment.

When the bellows 8 extends and contracts due to the up and down movement of the support rod 7, adjacent bellows plates 15, 15 repeatedly come into close contact with and break away from one another. The processing-side bellows plates 18, 18 repeatedly, over a course of several cycles, receive bending force acting about the foreign matter 21 when the foreign matter 21 becomes airborne and enters between adjacent bellows plates 15, 15 from the processing side (vacuum). In this case, the processing-side bellows plate 18 is thick, and therefore durable, and the plate is more tolerable to foreign matter 21 than is the two-layer structured bellows of Prior Art 2 due to the presence of the air, Ar, or other gas layer 20 as a backing layer. On the other hand, the non-processing-side bellows plate 19 has reduced bending deformation because the bending deformation brought about in the processing-side bellows plate 18 by the ingress of foreign matter 21 is transmitted via the gas layer 20, and even a repeated bending deformation that occurs fails to produce failure over an extended period of time because the plate itself is thin and can therefore closely follow the bending deformation.

As described above, the processing-side bellows plate 18 of the bellows 8 according to the present invention is a member that has the sealing and reinforcing functions inherent in a bellow plate, and the non-processing-side bellows plate 19 also functions as a sealing member. Additionally, the processing-side bellows plate 18 can remain durable because the plate is thick and has an air, Ar, or other gas layer 20 as a backing layer. On the other hand, the non-processing-side bellows plate 19 undergoes reduced bending deformation because the bending deformation brought about in the processing-side bellows plate 18 by the ingress of foreign matter 21 is received via the gas layer 20, and even a repeated bending deformation that occurs over an extended period of time does not lead to failure because the plate itself is thin and can therefore closely follow the bending deformation.

Furthermore, a so-called redundant bellows provided with a double-layer safety measure can be provided. The bellows can continue to operate while remaining sealed because of the presence of the thin non-processing-side bellows plate 19 even when the processing-side bellows plate 18 fails as a result of extended use.

REFERENCE SIGNS LIST

1 GATE VALVE
2 THROUGH HOLE
3 VALVE BOX
4 VALVE PLATE
5 VALVE PLATE
6 VALVE ASSEMBLY
7 SUPPORT ROD
8 BELLOWS
9 AIR CYLINDER
10 O-RING

11 UPPER RING MEMBER
12 LOWER RING MEMBER
13 O-RING
15 BELLOWS PLATE
16 INSIDE-DIAMETER SIDE OF BELLOWS PLATE
17 OUTSIDE-DIAMETER SIDE OF BELLOWS PLATE
18 PROCESSING-SIDE BELLOWS PLATE
19 NON-PROCESSING-SIDE BELLOWS PLATE
20 GAS LAYER
21 FOREIGN MATTER
S1, S2 VACUUM PROCESSING CHAMBER
G GATE

The invention claimed is:

1. An accordion-structured welded bellows for a semiconductor-manufacturing device in which a plurality of annular bellows plates having curved surfaces in a radial direction are connected in an alternating fashion on the outside-diameter side and the inside-diameter side, characterized in that:
 the annular bellows plates have a processing-side bellows plate and a non-processing-side bellows plate;
 a gas layer is interposed between the two bellows plates;
 the processing-side bellows plate is configured as a thick plate; and
 the non-processing-side bellows plate is configured as a thin plate.

2. The welded bellows for a semiconductor-manufacturing device according to claim 1, characterized in that:
 the processing side is a vacuum; and
 the non-processing side is the atmosphere.

3. The welded bellows for a semiconductor-manufacturing device according to claim 1, characterized in being used for sealing a gate valve with which an opening in a vacuum processing chamber used in a manufacturing step of a semiconductor-manufacturing device can be opened and closed in an airtight manner.

4. The welded bellows for a semiconductor-manufacturing device according to claim 1, characterized in being actuated by extension and contraction within a range of several hertz, the extension and contraction speed being 100 mm/sec or greater, and the cyclic service life being $1 \times 10^6$ or greater.

5. The welded bellows for a semiconductor-manufacturing device according to claim 2, characterized in being used for sealing a gate valve with which an opening in a vacuum processing chamber used in a manufacturing step of a semiconductor-manufacturing device can be opened and closed in an airtight manner.

6. The welded bellows for a semiconductor-manufacturing device according to claim 2, characterized in being actuated by extension and contraction within a range of several hertz, the extension and contraction speed being 100 mm/sec or greater, and the cyclic service life being $1 \times 10^6$ or greater.

7. The welded bellows for a semiconductor-manufacturing device according to claim 3, characterized in being actuated by extension and contraction within a range of several hertz, the extension and contraction speed being 100 mm/sec or greater, and the cyclic service life being $1 \times 10^6$ or greater.

8. The welded bellows for a semiconductor-manufacturing device according to claim 5, characterized in being actuated by extension and contraction within a range of several hertz, the extension and contraction speed being 100 mm/sec or greater, and the cyclic service life being $1 \times 10^6$ or greater.

* * * * *